United States Patent [19]

Sidor

[11] 4,137,512
[45] Jan. 30, 1979

[54] CONTACTLESS MAGNETIC SWITCH

[75] Inventor: Edward F. Sidor, Lombard, Ill.

[73] Assignee: Illinois Tool Works Inc., Chicago, Ill.

[21] Appl. No.: 796,573

[22] Filed: May 13, 1977

[51] Int. Cl.² .............................................. H01H 36/00
[52] U.S. Cl. ................................. 335/206; 323/94 H; 336/110
[58] Field of Search ......................... 335/206, 207, 205; 338/32 R, 32 H, 32 S, 12; 323/94 H; 336/110; 307/309; 324/151 R, 251, 252

[56] References Cited

U.S. PATENT DOCUMENTS

| | | | |
|---|---|---|---|
| 3,060,291 | 10/1962 | Clare | 335/206 |
| 3,476,997 | 11/1969 | Otzipka et al. | 307/309 X |
| 3,958,203 | 5/1976 | Bernin | 336/110 |
| 3,988,710 | 10/1976 | Sidor et al. | 338/32 R |

Primary Examiner—J. V. Truhe
Assistant Examiner—D. A. Tone
Attorney, Agent, or Firm—Glenn W. Bowen; Robert W. Beart

[57] ABSTRACT

A contactless magnetic switch is provided by utilizing at least one pair of hollow elongated tubular magnetic sensing elements which are each threaded with at least one sense wire and a movable permanent magnet which is positioned adjacent and over the sensing elements. The magnet has two straight edges which in a nominal zero position of the switch extend along the longitudinal axes of the sensing elements, preferably for a distance which is slightly longer than their lengths. The magnet is carried in a revolvable or otherwise movable carrier. If the carrier is revolvable, the magnet may be shaped as part of a circular disc and the two tubes may have their longitudinal axes disposed at an angle relative to each other so that when the permanent magnet is rotated in one direction from the initial zero position, one of the sensing elements will lie completely under the magnet while the other will be removed from the magnet and not affected by it. Thus, the sensing element under the magnet will be substantially completely saturated, thereby providing a low output voltage on its associated sense winding while the other sensing element will be substantially unsaturated thereby supplying a high output voltage on its sensing winding. As the permanent magnet is rotated in one direction or the other over the sensing elements, a sharp transition of the saturation state of the sensing elements provides the desired switching function.

17 Claims, 6 Drawing Figures

U.S. Patent      Jan. 30, 1979      4,137,512
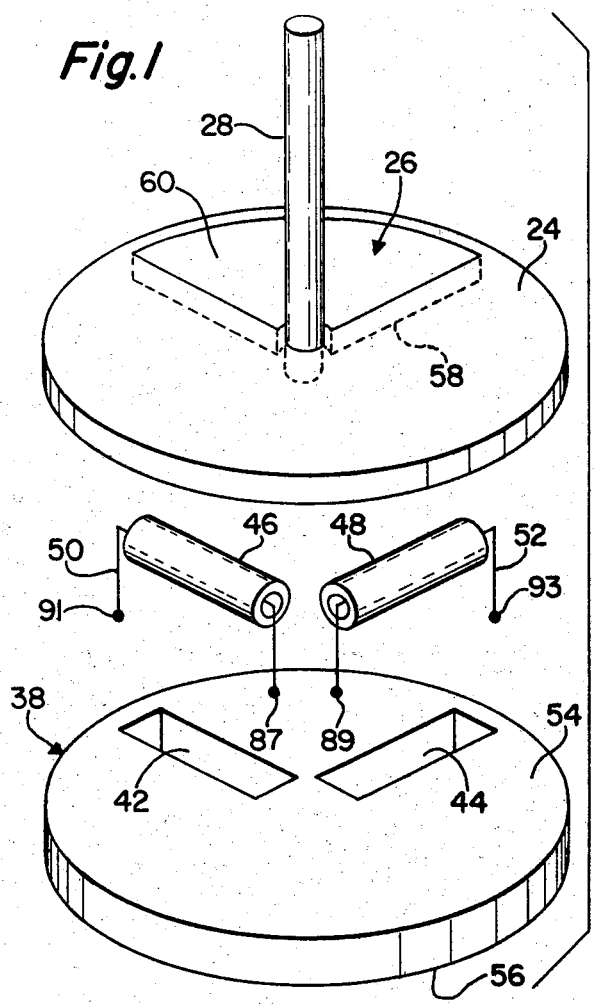
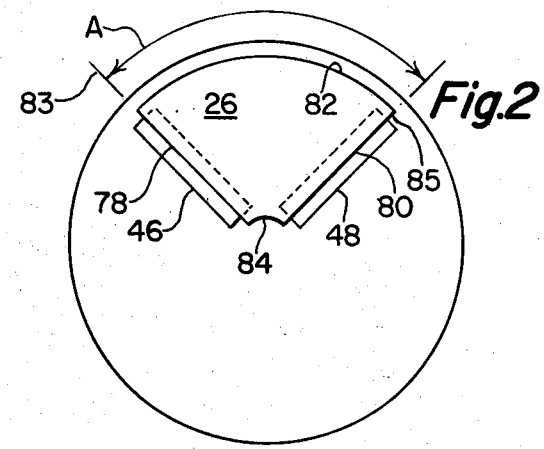
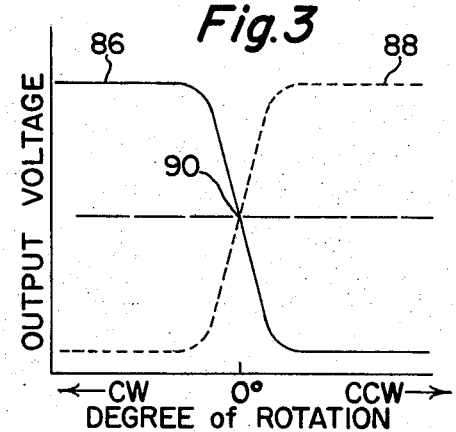
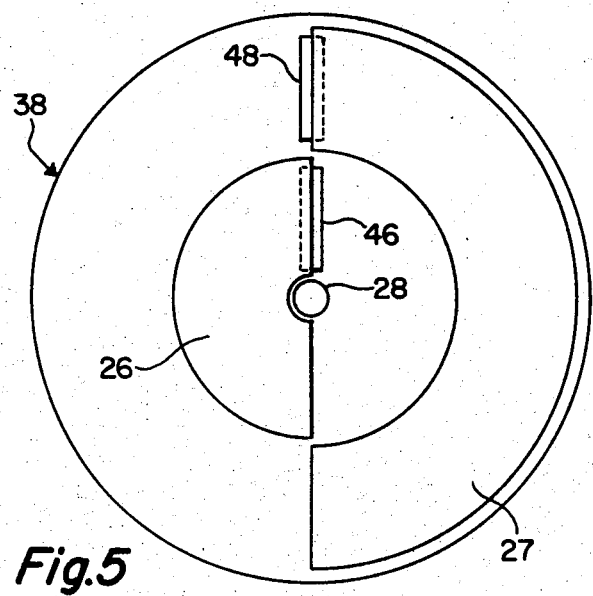
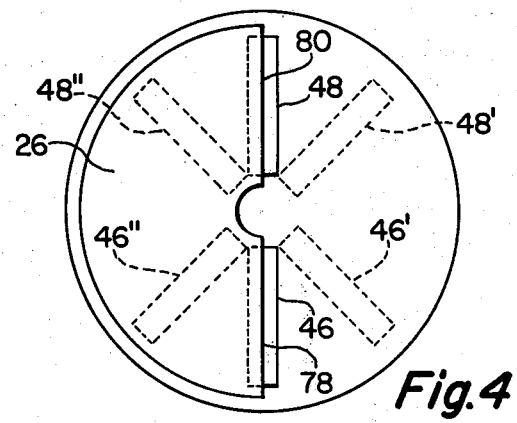
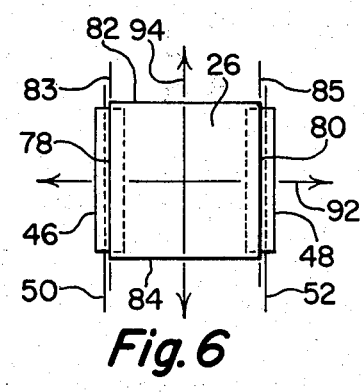

CONTACTLESS MAGNETIC SWITCH

BACKGROUND OF THE INVENTION

In U.S. Pat. No. 3,988,710, entitled "Contactless Linear Rotary Potentiometer", filed in the name of Edward Frank Sidor and Frank B. Desio and assigned to the assignee of the present invention, a device was disclosed in which a rotary shaft was coupled to a rotor that carried a permanent magnet which was formed in the shape of a portion of a circle, and a pair of elongated, hollow magnetically saturable, tubular sensing elements were positioned adjacent the rotor. The sensing elements each had at least one drive winding threaded through them and they were positioned with their axes aligned at an acute angle and were inserted into slots in a spacer that was positioned directly below the rotor that carried the magnet. A very linear contactless potentiometer was thus achieved with the initial position of the potentiometer being set so that the straight edges of the magnet werre initially positioned normal to the elongated axes of the two hollow sensing elements.

The device of the present invention is an entirely different type of device in that it functions as a contactless switch wherein the change of saturation state of the magnetic sensing elements from a saturated to a nonsaturated condition is a rapid one as the permanent magnet is displaced slightly from its initial position, and not a linear gradually changing condition such as occured in the prior Sidor et al patent. The version that is shown in FIGS. 1 and 2 is presently preferred since the switching mechanism of the present invention can be implemented by using the same basic components as that shown in the prior Sidor et al patent, with the exception of the spacer that is below the rotor which is provided with slots that are aligned so that the acute angle that is formed by the elongated axes of the sensing elements faces in the opposite direction than it did in the Sidor et al patent.

By this simple modification, the embodiment of FIGS. 1 and 2 provides an entirely different type of sensing device since the straight edges of the permanent magnet of the present invention are initially aligned substantially along the elongated axes of the sensing elements and not normal to them as in the prior Sidor et al patent. Thus, instead of a very linear change of output signal from the sensing elements with respect to the position of the rotor, a very rapid change in output signal is obtained, as illustrated in FIG. 3, thereby providing the contactless switching action.

DESCRIPTION OF THE DRAWINGS

The present invention is illustrated by reference to the drawings in which:

FIG. 1 is an exploded view of a two-element rotary magnetic switch constructed in accordance with the present invention;

FIG. 2 is a top view of the switch of FIG. 1 with the permanent magnet being aligned in an initial "0" position with respect to the sensing elements;

FIG. 3 is a graph illustrating the voltage vs. rotational characteristics of the embodiment of FIGS. 1 and 2;

FIG. 4 is an alternate version of a magnetic switch in which the axes of the tubes are in alignment along the same lines;

FIG. 5 is an alternate view of a rotational switch in which the two sensing elements have their axes along the same line, but the rotary carrier contains two separate magnets each of which affects only one of the sensing elements; and FIG. 6 is an alternate, non-rotational, version of a magnetic switch in which the longitudinal axes of the elongated sensing elements are aligned in parallel and the permanent magnet is free to move in one direction to provide a contactless switching action or in a direction normal to this direction to provide for linear position sensing.

TECHNICAL DESCRIPTION OF THE INVENTION

A disc-shaped rotor 24 of electrically insulating material carries a permanent magnet 26 as shown in FIG. 1. The permanent magnet 26 is shaped as a portion of a circle. A vertically disposed shaft 28 extends through and is secured to the center of the rotor 24 and the inner edge 84 of the magnet 26 is curved to conform to the cylindrical shaft. The permanent magnet 26 and the rotor 24 thus rotate as a unit when the shaft 28 is rotated. A disc-shaped spacer 38 of electrically insulating material, is positioned below the rotor 24. The spacer 38 has a pair of elongated, rectangular shaped slots 42, 44 in it, which are positioned on the same side of the spacer as is the permanent magnet 26. The recesses or slots 42, 44 receive the sensing elements 46, 48 therein. The sensing elements 46, 48 are preferably hollow, elongated, cylindrical tubes that are made of a magnetically permeable and saturable material, and they have at least one conductive sense wire 50, 52 running respectively therethrough so as to form two inductive sensing elements. The sense wires 50, 52 are connected at their ends 87, 89 which are in turn connected to a common terminal (not shown). The ends 91, 93 and the interconnected terminals 87, 89 may then be coupled to a conventional differential sensing circuit in order to provide for the sensing of the output voltages from the elements 46, 48, which is representative of the desired switching action.

The slots 42, 44 are preferably deep enough so that when the elements 46, 48 are inserted into them, the periphery of these elements will lie wholly within the surfaces 54, 56 so as to enable the lower face 58 of the magnet 26 to pass directly over the slots 42, 44 without contacting the elements 46, 48. The permanent magnet 26 is magnetized so that its lower face 58 has one magnetic polarity while its upper face 60 has the opposite magnetic polarity. If desired, a second rotor (not shown) may be employed below the spacer 38 with a second magnet inserted into it, and with the second rotor also being secured to the shaft 28 to provide a better magnetic field distribution, but, of course, this will be achieved at an added cost.

While it is preferred that the elements 46, 48 be constructed as described, it is apparent that they do not have to be in the form of a hollow cylindrical tube and may alternately assume other forms including a solid cylindrical shape or a solid or hollow rectangular shape, all of which are easily produced and which form a substantially rectangular projection in the plane parallel to the surfaces 54, 56 of the spacer 38, as shown in FIG. 2. In addition, while a magnetically saturable ferrite material is preferred for the sensing elements, it is apparent that they may comprise various other types of elements, including a Hall effect, magneto-resistive, galvano-magnetic semiconductor, transformer coupled (which can be achieved with the disclosed embodiments merely by adding an additional current carrying wire through each of the elements 46, 48 to act as a drive wire, with the wires 50, 52 still assuming the function of sense wires), and wound core devices; providing the selected device is capable of being affected so that output signal with a rapid change of slope from one state to the other occurs as the permanent magnet is rotated so that it overlies one sensing element while it is removed from the other sensing element, in the manner described therein.

FIG. 2 shows the relationship between the shape of the elongated cylindrical or rectangular shaped elements 46, 48 and the permanent magnet 26. The most convenient way in which the magnet 26 may be formed for the embodiment of FIG. 1 is in the shape of a segment of a circle, while other shapes may be readily adapted for use by those skilled in the art. The shape of the outer curved edge 82 and the inner edge 84 is not of particular importance with respect to the operation of the contactless switch of the present invention, but they preferably should extend beyond the elongated dimensions of the elements 46, 48 as shown in FIG. 2. The edges 78, 80 of the magnet 26 should, however, be substantially straight to provide the desired rapid switching action.

When the magnet 26 is aligned in FIG. 2 which may nominally be termed a "zero" position, the elements 46, 48 will both have approximately half of their volumes saturated. The curve 86 of FIG. 3 represents the output voltage that is obtained from the element 46 while the curve 88 represents the output voltage that is obtained from the sensing element 48. When the magnet 26 is positioned as shown in FIG. 2, the curves 86 and 88 will intersect at the crossover point 90, which represents this "zero" rotational state of the magnet 26. When the magnet 26 is positioned as shown in FIG. 2, both of the elements will be partially saturated and the output voltages from them will be substantially equal as represented by the point 90. As the magnet 26 moves in a counter-clockwise direction from the position of FIG. 2, the greater volume of the element 46 will become saturated while a smaller volume of the element 48 will be saturated. At the time the edge 78 extends completely beyond the element 46 so that the element 46 is completely under the magnet 26, this element will become completely saturated. The edge 80 at this time will then be clear of the element 48 and since no part of the magnet 26 will then overlie the element 48 it will consequently be relatively substantially unsaturated. The inductance of the element 46 will then decrease and the corresponding output voltage, as shown by the curve 86, will consequently drop to a minimum level as shown in FIG. 3. The element 48 will simultaneously come out of saturation and, therefore, the corresponding output voltage will increase to a maximum value, as indicated by the curve 88. Obviously, if the rotation of the rotor 24 were in the opposite, or clockwise, direction, the element 48, instead of the element 46, would become saturated and the edge 80 would extend over it, while the element 46, instead of the element 48, would come out of saturation as the edge 78 was removed from it.

Although the permanent magnet 26 is shown as being formed as a segment of a circle in which the angle A, formed by the elongated axes 83, 85 of the elements 46, 48, is an acute angle, it is not necessary that this angle be so limited in the present invention. For example, in FIG. 4, the edges 78, 80 are in alignment with each other along the same line and the sensing elements 46, 48 also have their longitudinal axis in alignment along this line. The magnet 26 of this embodiment is thus formed as a semicircular element. The magnet 26 may even extend to form an even larger portion of a circular segment since the sensing elements may be positioned at locations such as the locations 46', 48', shown in FIG. 4. In addition, the invention is not necessarily limited to the use of only one pair of sensing elements since a multiple of pairs of sensing elements may be utilized. For example, with reference again to FIG. 4, three pairs of locations for the sensing elements are indicated by the locations 46, 48 for a first pair of elements, the locations 46', 48' for a second pair of elements, and the locations 46", 48" for a third pair of sensing elements. In this embodiment, as the rotor 24 rotates, it may cause a switching action as the edge 80 extends beyond the element 48 while the edge 78 is removed from the element 46. It may also cause a second switching action as the edge 80 extends completely over the element 48' while the edge 78 is removed from the element 46". A third switching action may then be achieved as the edge 80 extends completely over the switching element 46' while the edge 78 is removed from the switching element 48". The number of pairs of switching elements that may be thus employed is limited only by the reasonable size of the elements and the rotor for the desired application.

Another alternate version of the present invention is shown in FIG. 5 in which the spacer 38 carries two separate permanent magnets 26, 27, with the permanent magnet 26 being formed as a half circle segment which is centered around the shaft 28, while the magnet 27 is formed as a ring segment which has an inner diameter that is slightly larger than the outer diameter of the circular magnet 26. The elements 46, 48 are then aligned with their axes along the same line. It can be seen, therefore, that the present invention may be implemented in various configurations that are within the skill of those skilled in the art.

In addition, the present invention is not limited to a rotational type of switching mechanism since it may be implemented in other ways, as shown in FIG. 6, in which the elements have been numbered with the same numbers as were the corresponding elements of FIGS. 1 and 2. In FIG. 6, the permanent magnet 26 is rectangular in shape and is initially aligned over the elements 46, 48 which have their elongated axes aligned parallel to each other. The motion of the permanent magnet 26 in the direction of the arrow 92, therefore, will allow for the described switching action since the edge 78 that is associated with the element 46 may be moved completely over the remainder of the element 46 while the edge 80 will simultaneously be moved from the vicinity of the element 46 when the magnet 26 is moved to the right. Similarly, when the magnet 26 is moved to the left, the edge 78 will extend completely over the element 46 while the edge 80 will be removed completely from the element 48. The motion of the magnet 26 in a left or right direction along the line indicated by the arros 92 thereby controls the saturation state of the elements 46, 48 so that they provide the desired switching function indicated by the curves of FIG. 3.

The embodiment of FIG. 6, in addition to providing a contactless switching action, has the additional advantage of being capable of providing a linear output response. This is achieved by moving the permanent magnet 26 either in an up or down direction as indicated by the arrow 94. Once the magnet is aligned as shown in FIG. 6, with the edges 78, 80 aligned substantially along the elongated axes 83, 85 of the sensing elements 46, 48, motion of the permanent magnet in either direction from this central location along the line represented by the arrow 94 (after a short initial motion occurs to allow either the edge 82 or the edge 84 to clear the ends of the elements 46, 48,) will result in a smaller amount of the volume of both of the elements 46, 48 being saturated. This motion will, therefore, provide a linear output voltage vs. position indication on the sense lines 50, 52 as the magnet is moved either up or down along the direction of the arrows 94. When the magnet is in the nominal zero position shown in FIG. 6, substantially half of the volume of each of the sensing elements 46, 48 will be saturated. Thus, both a contactless linear switch and a contactless linear position sensor is provided through use of the same device.

The cost of the construction of the contactless switch of the present invention, therefore, is relatively low since the permanent magnet does not need to be specially shaped and it may merely be formed as a segment of a circle, as shown in FIG. 1, or may be rectangular, as shown in FIG. 6. Furthermore, the size of the device when it is implemented as a rotary switch, may be relatively small since the sensing elements may be aligned with a relatively small acute angle with respect to each other. Another notable advantage of the disclosed contactless device of the present invention is that it is highly resistant to shocks and vibrations, which resistive devices are not, and that it is capable of operating at temperatures as high as 200° C.

What is claimed is:

1. An electrical contactless switching device for achieving a rapid change in output signal constituting a switching action comprising first and second elongated, contactless sensing elements constructed to be electrically interconnectable, each of said sensing elements having a substantially straight longitudinal axis and being shaped to form a rectangular projection in a plane and being of the type that undergo a continuous change of condition between a first state and a second state in accordance with the area of said projection that is influenced by a local magnetic field, at least one permanent magnet positioned adjacent said sensing elements, to provide said local magnetic field, said permanent magnet being shaped to have first and second substantially straight edges, each of which passes adjacent to one of said rectangular projections so that when one of said edges is aligned along the entire longitudinal axis of one of said sensing elements the other of said edges will be aligned along the entire longitudinal axis of the other of said sensing elements.

2. A contactless switch as claimed in claim 1, wherein each of the sensing elements comprise a hollow, cylindrically shaped tube made of a magnetically saturable material and a sense wire that is coupled to said tube.

3. A contactless switching device as claimed in claim 1, wherein said permanent magnet is coupled to a rotation means which provides for the rotation thereof and said permanent magnet is formed as a segment of a circle.

4. A contactless switch as claimed in claim 3, wherein each of the sensing elements comprise a hollow, cylindrically shaped tube made of a magnetically saturable material and a sense wire that is coupled to said tube.

5. A contactless switch as claimed in claim 3, wherein said sensing elements have their longitudinal axes aligned in a line with each other and said edges of said permanent magnet are also aligned with each other along the same line.

6. A contactless switch as claimed in claim 11, wherein each of the sensing elements comprise a hollow, cylindrically shaped tube made of a magnetically saturable material and a sense wire that is coupled to said tube.

7. A contactless switching device as claimed in claim 5, wherein at least one additional pair of sensing elements, of the same type as said first and second sensing elements and which have their longitudinal axes in alignment with each other along a line that makes an angle with the longitudinal axes of said first and second sensing elements, is employed.

8. A contactless switch as claimed in claim 7, wherein each of the sensing elements comprise a hollow, cylindrically shaped tube made of a magnetically saturable material and a sense wire that is coupled to said tube.

9. A contactless switching device as claimed in claim 3, wherein said permanent magnet has two faces that lie approximately parallel to said sensing elements, said faces being oppositely polarized.

10. A contactless switching device as claimed in claim 1, comprising a turning shaft, a disc-shaped spacer made of electrically insulating material and provided with first and second generally rectangular-shaped slots which are aligned to substantially correspond to said rectangular-shaped projections so that each of said slots receives one of said sensing elements therein and a disc-shaped rotor coupled to said shaft and made of electrically insulating material which carries said permanent magnet adjacent said spacer.

11. A contactless switch as claimed in claim 10, wherein each of the sensing elements comprise a hollow, cylindrically shaped tube made of a magnetically saturable material and a sense wire that is coupled to said tube.

12. A contactless switch as claimed in claim 11, wherein said permanent magnet is formed as a segment of a circle.

13. A contactless switching device as claimed in claim 1, wherein said sensing elements have their longitudinal axes aligned along the same line, and said permanent magnet means comprises first and second permanent magnets, with said first permanent magnet being formed in the shape of a semi-circular segment and said second permanent magnet being formed in the shape of a semi-circular ring which has an inner diameter that is slightly larger than the outer diameter of said first permanent magnet with said first and second permanent magnets being coupled together for simultaneous movement.

14. A contactless switch as claimed in claim 13, wherein each of the sensing elements comprise a hollow, cylindrically shaped tube made of a magnetically saturable material and a sense wire that is coupled to said tube.

15. A contactless switching device as claimed in claim 1, wherein the longitudinal axes of said sensing elements are aligned in parallel and said permanent magnet means is rectangular in shape so that a switching action occurs as said rectangular permanent magnet is moved in a first direction wherein one of said edges is removed from one of said sensing elements, so that said first sensing element does not lie under any portion of said permanent magnet while the other of said edges is positioned beyond the second of said sensing elements so that said sensing element lies entirely under said permanent magnet.

16. A contactless switch as claimed in claim 15, wherein each of the sensing elements comprise a hollow, cylindrically shaped tube made of a magnetically saturable material and a sense wire that is coupled to said tube.

17. A contactless switching device as claimed in claim 16, wherein motion of said permanent magnet in a direction normal to said first direction will result in a substantially linear output signal from said sensing elements due to a smaller amount of the volume of both of said sensing elements being progressively disposed under said permanent magnet as said permanent magnet is moved in said normal direction from a nominal zero position in which substantially half of the volume of each of the sensing elements is saturated.

* * * * *